(12) United States Patent
Kumar et al.

(10) Patent No.: US 9,906,241 B2
(45) Date of Patent: Feb. 27, 2018

(54) APPARATUS AND METHOD FOR TURBO PRODUCT CODES

(71) Applicant: SK hynix memory solutions inc., San Jose, CA (US)

(72) Inventors: Naveen Kumar, San Jose, CA (US); Aman Bhatia, San Jose, CA (US); Lingqi Zeng, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/948,197

(22) Filed: Nov. 20, 2015

(65) Prior Publication Data

US 2016/0149592 A1 May 26, 2016

Related U.S. Application Data (60) Provisional application No. 62/082,455, filed on Nov. 20, 2014.

(51) Int. Cl.
*H03M 13/09* (2006.01)
*H03M 13/15* (2006.01)
*H03M 13/29* (2006.01)

(52) U.S. Cl.
CPC ....... *H03M 13/2963* (2013.01); *H03M 13/29* (2013.01); *H03M 13/2921* (2013.01); *H03M 13/2966* (2013.01); *H03M 13/098* (2013.01); *H03M 13/152* (2013.01); *H03M 13/2909* (2013.01); *H03M 13/2936* (2013.01)

(58) Field of Classification Search
CPC ......... H03M 13/2963; H03M 13/2921; H03M 13/29; H03M 13/2966; H03M 13/2909
USPC .......................................................... 714/755
See application file for complete search history.

(56) References Cited

U.S. PATENT DOCUMENTS

| | | | | |
|---|---|---|---|---|
| 6,526,538 | B1 * | 2/2003 | Hewitt | H03M 13/2918 375/262 |
| 6,628,723 | B1 * | 9/2003 | Gerlach | H03M 13/2963 375/259 |
| 7,100,101 | B1 * | 8/2006 | Hemphill | H03M 13/29 714/755 |
| 7,356,752 | B2 * | 4/2008 | Hewitt | H03M 13/2903 714/755 |
| 7,415,651 | B2 * | 8/2008 | Argon | H04L 1/0063 714/755 |
| 7,441,175 | B2 * | 10/2008 | Yeh | G11B 20/1833 714/758 |
| 7,502,982 | B2 * | 3/2009 | Silvus | H03M 13/2966 714/753 |
| 7,779,331 | B2 * | 8/2010 | Tan | G11B 20/1833 714/758 |
| 8,209,582 | B1 * | 6/2012 | Varnica | H03M 13/036 714/755 |
| 8,255,764 | B1 | 8/2012 | Yeo et al. | |

* cited by examiner

*Primary Examiner* — James C Kerveros
(74) *Attorney, Agent, or Firm* — IP & T Group LLP (57) ABSTRACT

An apparatus for a turbo product codes includes a codeword generator and an interleaver. The codeword generator receives a data in a matrix, and generate a turbo product code (TPC) codeword including the data, row parities and column parities. The interleaver interleaves the TPC codeword by assigning at least one bit in at least one row-column intersection of the TPC codeword to at least one master code, and outputs the interleaved TPC codeword.

16 Claims, 8 Drawing Sheets

: Error Bits

Master decoder input (810)  Master decoder output (820)

■ : Error Bits

FIG. 8B

Master decoder input (815)  Master decoder output (825)

■ : Error Bits

FIG. 9A

Master decoder input (910)   Master decoder output (920)

■ : Error Bits

FIG. 9B

Master decoder input (915)   Master decoder output (925)

■ : Error Bits

FIG. 10

APPARATUS AND METHOD FOR TURBO PRODUCT CODES

CROSS-REFERENCE TO RELATED APPLICATIONS

This application claims the benefit of U.S. Provisional Application No. 62/082,455, filed Nov. 20, 2014, the entire contents of which are incorporated herein by reference.

BACKGROUND

1. Field

Exemplary embodiments of the present disclosure relate to a signal processing and coding technique.

2. Description of the Related Art

Magnetic storage technology was most commonly used for storing data, but the lower weight and faster read/write operations requirements for current electronic devices make the magnetic storage technology less desirable. The NAND-based technology is able to fulfill the demand for high density data storage devices but this technology is costly. There exists a need to lower the cost of NAND-based technology while maintaining performance levels.

SUMMARY

Embodiments of the present disclosure are directed to a signal processing and coding technique which may provide high performance gains with the lower hardware complexity.

Embodiments of the present disclosure provide an apparatus and an operation method thereof using turbo product codes for gains in terms of performance and throughput.

Embodiments of the present disclosure provide an interleaver which may reduce the frequency of a master code decoding as well as push down an error floor at high code rates.

In accordance with an embodiment of the present invention, an apparatus includes a codeword generator and an interleaver. The codeword generator receives a data in a matrix, and generate a turbo product code (TPC) codeword including the data, row parities and column parities. The interleaver interleaves the TPC codeword by assigning at least one bit in at least one row-column intersection of the TPC codeword to at least one master code, and outputs the interleaved TPC codeword.

In accordance with another embodiment of the present invention, a method includes generating a turbo product code (TPC) codeword including a data in a matrix, row parities and column parities. The method further includes interleaving the TPC codeword by assigning at least one bit in at least one row-column intersection of the TPC codeword to at least one master code, and outputting the interleaved TPC codeword.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

One way to reduce the cost of NAND-based technology involves scaling down the process, but the scaling down process degrades the performance. This performance loss can be compensated by using advanced signal processing and coding techniques. Bose-Chaudhuri-Hocquenghem (BCH) codes and low density parity check (LDPC) codes have been used to ensure the data integrity. For BCH codes, the key drawback is that they cannot be used for soft decision decoding which makes these codes undesirable. LDPC codes provide good hard and soft decision decoding performances. The complexity of the LDPC decoder, however, is quite high, which makes this solution expensive for the hardware implementation. An advanced coding technique which can provide high performance gains with the lower hardware complexity is disclosed and described below.

A turbo product code (TPC) is considered as an advanced coding technique which can provide significant gains at much lower hardware complexity compared to LDPC codes. In hard decision decoding, TPC gives significant performance gains compared to BCH and LDPC codes. In soft decision decoding, TPC achieves performance gains close to LDPC codes.

The TPC is considered as an advanced coding technique which can provide significant gains at much lower hardware complexity compared to LDPC codes. In hard decision decoding, TPC gives significant performance gains compared to BCH and LDPC codes. In soft decision decoding, TPC achieve performance gains close to LDPC codes.

Figure 3A:
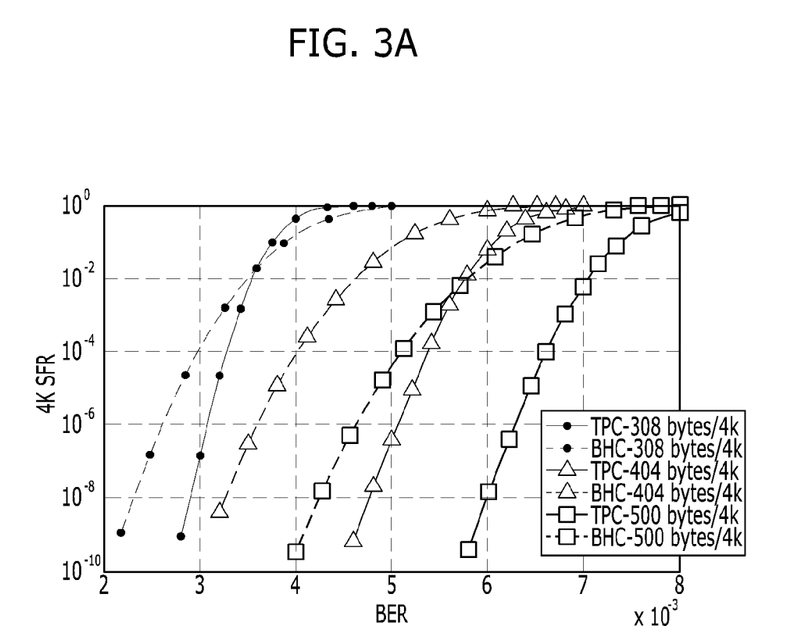
FIG. 3A is a graph indicating performance for turbo product code (TPC) for different code rates.
Figure 3B:
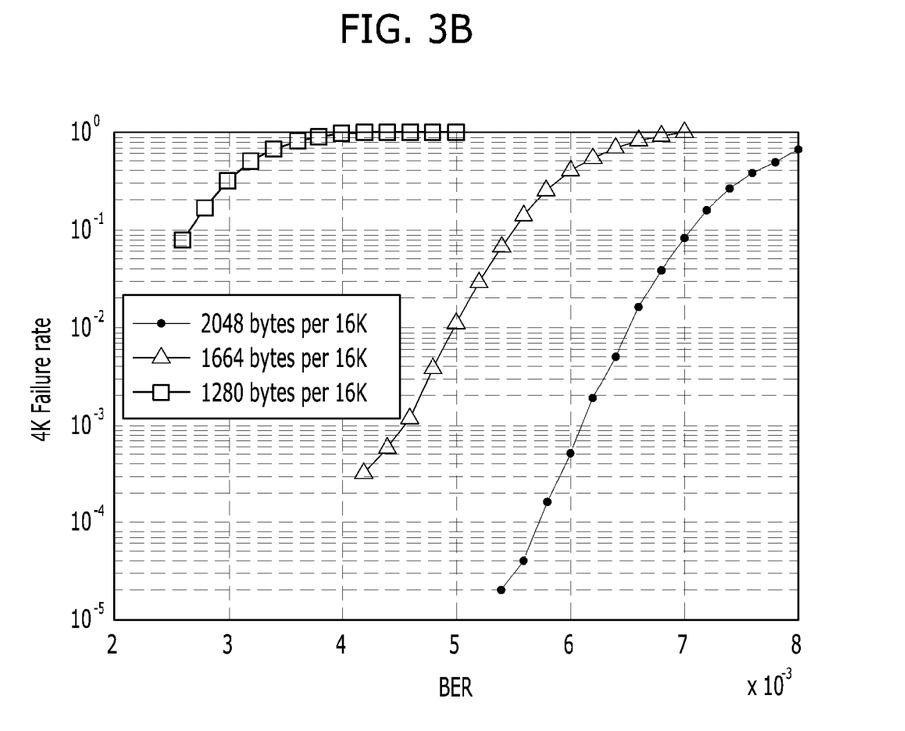
FIG. 3B is a graph indicating the probability of master code decoding for different code rates.

The TPC codes may have the drawbacks in terms of performance loss at high code rates and throughput loss. The TPC code strategy may give an error floor at high code rates. This error floor may be reduced by increasing the correction capability of a master code. But this degrades the waterfall performance significantly (See FIG. 3A). If the correction capability of the master code is increased at the expense of the row/column codes, the probability of going to the master code decoding becomes quite high while decoding data for the highest code rate (e.g., a 4K data) (See FIG. 3B for the highest code rate). For instance, it implies that for decoding a 4K data, an entire page of length 16K will be used for decoding. This frequent page reading will affect throughput which makes this solution unacceptable for providing high throughputs.

As a result, there is a need for an advanced coding technique to provide gains in terms of performance and throughput in a system using turbo product codes. In this disclosure, novel techniques are proposed to design a master interleaver which reduces the frequency of the master code decoding as well as pushes down the error floor to the desired regime.

Figure 1:
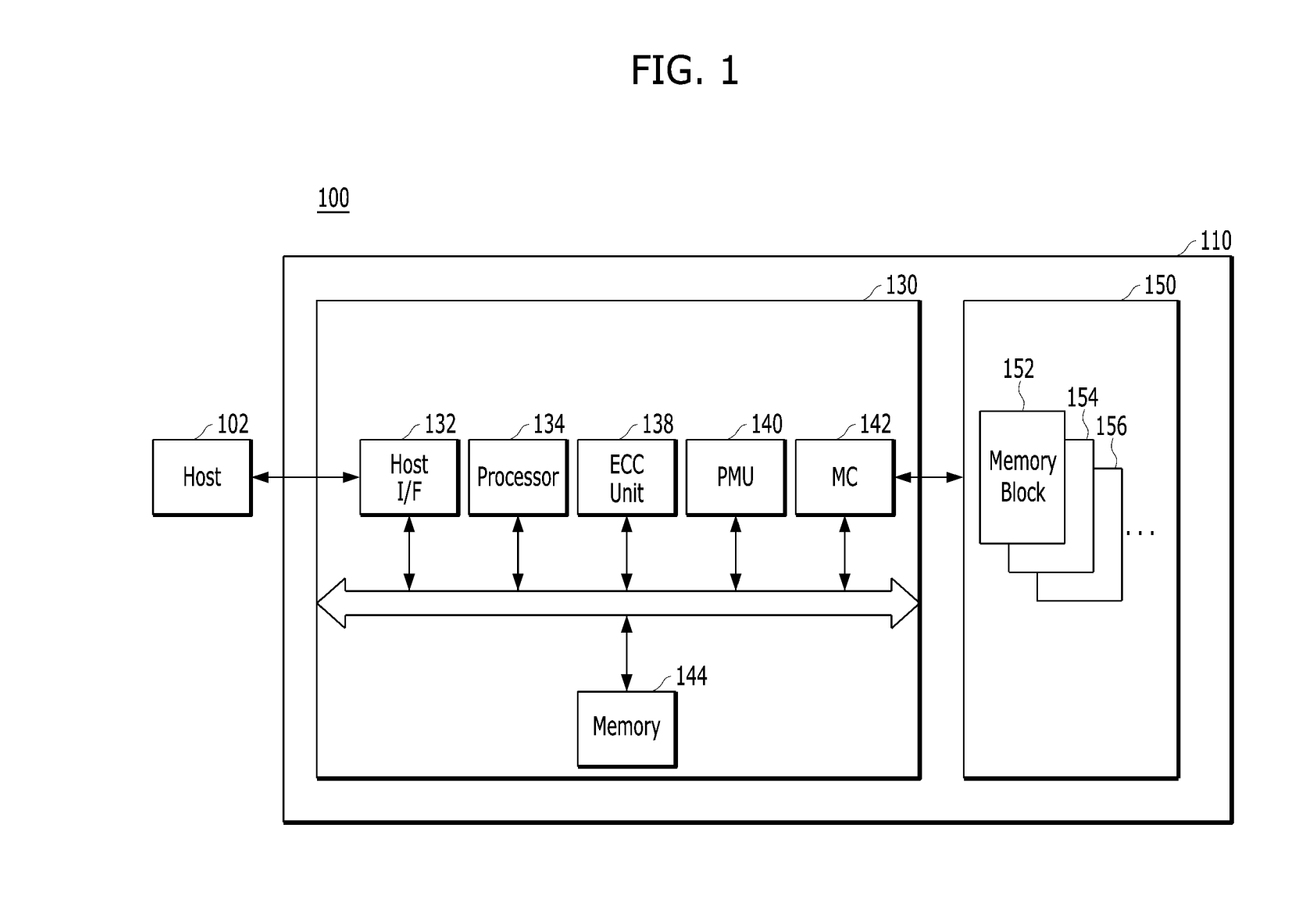
FIG. 1 illustrates a data processing system including a memory system in which embodiments of the present invention are applied.

In some embodiments, the present invention will be applied to a data processing system shown in FIG. 1.

FIG. 1 illustrates a data processing system 100 including a memory system in which embodiments of the present invention are applied. The data processing system 100 shown in FIG. 1 is for illustration only. Other constructions of the data processing system 100 could be used without departing from the scope of this disclosure. Although FIG. 1 illustrates one example of the data processing system 100, various changes may be made to FIG. 1. For example, the data processing system 100 may include any of elements, or may not include any of elements in any suitable arrangement.

Referring to FIG. 1, the data processing system 100 may include a host 102 and a memory system 110.

The host 102 may include, for example, a portable electronic device such as a mobile phone, an MP3 player and a laptop computer or an electronic device such as a desktop computer, a game player, a TV and a projector.

The memory system 110 may operate in response to a request from the host 102, and in particular, store data to be accessed by the host 102. In other words, the memory system 110 may be used as a main memory system or an auxiliary memory system of the host 102. The memory system 110 may be implemented with any one of various kinds of storage devices, according to the protocol of a host interface to be electrically coupled with the host 102. The memory system 110 may be implemented with any one of various kinds of storage devices such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and so forth.

The storage devices for the memory system 110 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory system 110 may include a memory device 150 which stores data to be accessed by the host 102, and a controller 130 which controls storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device and configure a memory card. The controller 130 and the memory device 150 may be integrated into one semiconductor device and configure a memory card such as a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may configure a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply is interrupted and, in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a non-volatile memory device, for example, a flash memory. The flash memory may have a three-dimensional (3D) stack structure.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program and erase operations.

In detail, the controller 130 may include a host interface unit 132, a processor 134, an error correction code (ECC) unit 138, a power management unit (PMU) 140, a memory controller (MC) 142, and a memory 144.

The host interface unit 132 may process commands and data provided from the host 102, and may communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The MC 142 may serve as a memory interface between the controller 130 and the memory device 150 to allow the controller 130 to control the memory device 150 in response to a request from the host 102. The MC 142 may generate control signals for the memory device 150 and process data under the control of the processor 134. When the memory device 150 is a flash memory such as a NAND flash memory, the MC 142 may generate control signals for the NAND flash memory 150 and process data under the control of the processor 134.

The memory 144 may serve as a working memory of the memory system 110 and the controller 130, and store data for driving the memory system 110 and the controller 130.

The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 110, and thus reliable bad block management is required.

Figure 2:
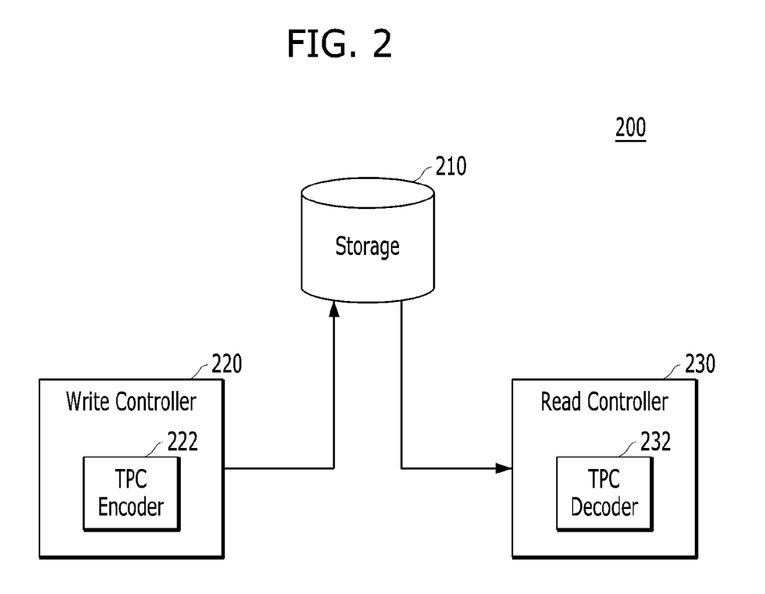
FIG. 2 is a block diagram of a memory system including an encoder and a decoder in accordance with embodiments of the present invention.

FIG. 2 is a block diagram of a memory system 200 including an encoder and a decoder in accordance with embodiments of the present invention. For example, the memory system 200 corresponds to the memory system 110 shown in FIG. 1. For clarity, components of FIG. 1 which are directly related to embodiments of the present invention are not shown herein.

Referring to FIG. 2, the memory system 200 includes a storage 210, a write controller 220 and a read controller 230. For example, the storage 210 corresponds to the memory device 150 shown in FIG. 1, and the write controller 220 and the read controller 230 correspond to the ECC unit 138 shown in FIG. 1.

The storage 210 may include solid state storage such as NAND flash. The write controller 220 receives data from host 102 in FIG. 1, and processes the data to store codewords on the storage 210. The read controller 230 reads the codewords on the storage 210, and processes the codewords. For example, TPC codewords are stored on the storage 210. The write controller 220 includes a TPC encoder 222 and the read controller 230 include a TPC decoder 232 as the components for the TPC codewords, respectively.

As described herein, the TPC code includes $N_r$ row codes and $N_c$ column codes. They are all BCH codes with the following parameters:

Row Codes: $(n_r, k_r, T_r, m_r)$;
Column Codes: $(n_c, k_c, T_c, m_c)$;

where n represents length of the codes, k represents dimension of the codes, T represents error-correction capability of the codes, and m represents finite field-size of the codes. The number of columns combined to generate one column codeword is specified by $C_\#$, where $C_\#$ is the number of columns combined.

Figure 4A:
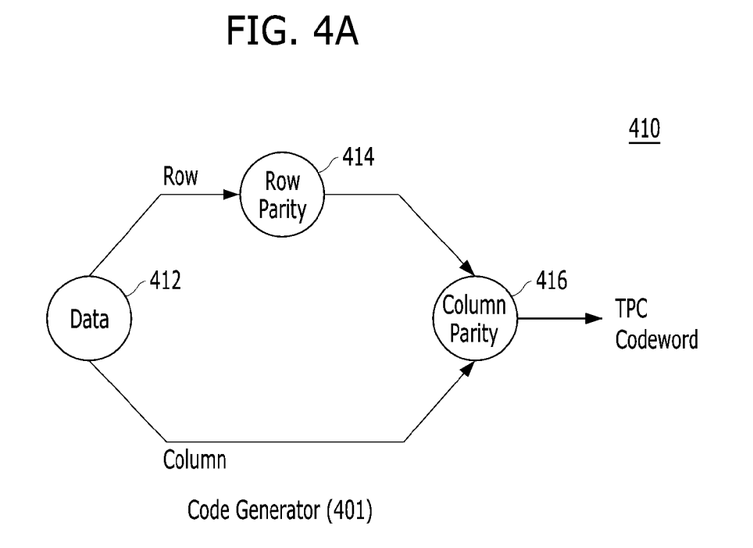
FIGS. 4A and 4B are diagrams illustrating the generation procedures of TPC codeword in accordance with embodiments of the present invention.

FIG. 4A is a flowchart illustrating the generation procedure 410 of a TPC codeword in accordance with an embodiment of the present invention.

Referring to FIG. 4A, the TPC structure generated by the generation procedure 410 may have a serial concatenation structure. In the serial concatenation structure, the row parities 414 are generated from the data 412 and columns are combined to generate the column parities 416.

In some embodiments, the generation procedure 410 is performed by a codeword generator 401. The codeword generator 401 receives data 412 in a matrix, and generates a TPC codeword including the data 412, row parities 414 and column parities 416. The codeword generator 401 generates the row parities 414 from row data of the matrix, generates the column parities 416 by combining the row parities 414 and column data, and generates the TPC codeword including the data 412, the row parities 414 and the column parities 416.

Figure 4B:
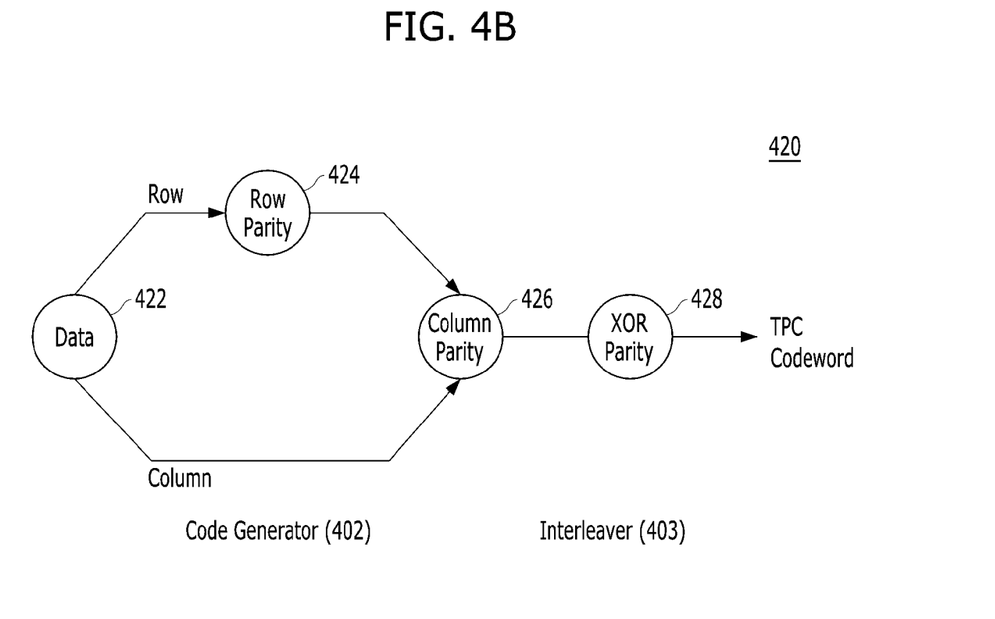

FIG. 4B is a drawing illustrating the generation procedure 420 of a TPC codeword in accordance with another embodiment of the present invention. This embodiment considers the XOR parity idea with the serial concatenation instead of the parallel concatenation.

Referring to FIG. 4B, the TPC structure generated by the generation procedure 420 may have the serial concatenation structure with XOR parity. In this structure, the row parities 424 are generated from the row data 422. Columns are combined to generate the column parities 426. The XOR parities 428 are computed by taking the XOR operation of all the row-column intersection data.

In some embodiments, the generation procedure 420 is performed by a codeword generator 402 and an interleaver 403. The codeword generator 402 receives data 422 in a matrix, and generates a TPC codeword including the data, row parities and column parities. The codeword generator 402 generates the row parities 424 from row data of the matrix, generates the column parities 426 by combining the row parities and column data, and generates the TPC codeword including the data, the row parities and the column parities.

The interleaver 403 interleaves 428 the TPC codeword by assigning at least one bit in at least one row-column intersection of the TPC codeword to at least one master code, and outputs the interleaved TPC codeword. The interleaver 403 assigns bits in the at least one row-column intersection of the TPC codeword to a plurality of master codes.

Figure 5:
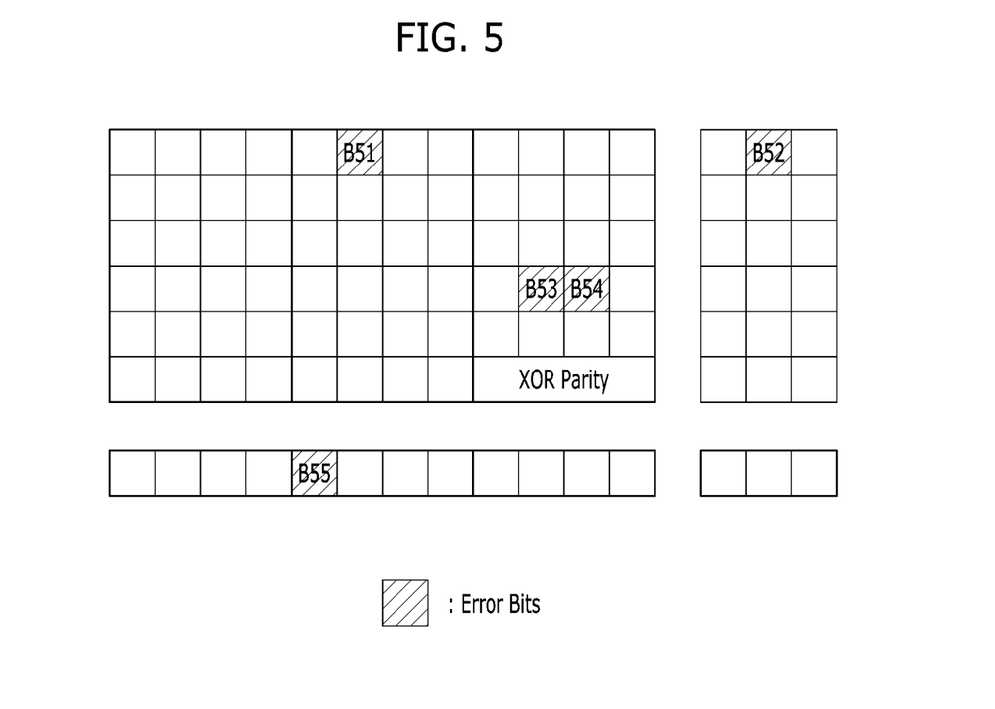
FIG. 5 is a diagram illustrating TPC structure with a stuck error pattern decodable in accordance with embodiments of the present invention.

FIG. 5 is a drawing illustrating TPC structure with a stuck error pattern decodable in accordance with embodiments of the present invention.

Referring to FIG. 5, a stuck error pattern is shown. The error pattern includes error bits B51-B55. The error pattern cannot get decoded by the base TPC code structure, such as a parallel concatenation structure with exclusive XOR parity. The correction capability of row and column codes is assumed to be equal to 1. In that scenario, a page data (16K) is required to decode the 4K user data. However, the disclosed code structure shown in FIG. 4B is capable of decoding the error pattern depicted in FIG. 5 with 4K data without using the 16K page data.

Master code interleaver design strategies in accordance with various embodiments of the present invention will be described, which may be used to push down the error floor to the desired regime with the minimum master code parity overhead.

Generally, there is always a tradeoff between the waterfall and the error floor in performance curves for well-designed codes. A reduction in the error floor leads to a loss in the waterfall region and a gain in the waterfall region leads to an increase in the error floor. The challenge is to find the minimum parity overhead scheme which will push down the error floor to the desired regime with the minimum waterfall performance loss. It should be noted that the most dominant error patterns observed in simulation of FIG. 5 involves errors in one row-column intersection. The present invention proposes two schemes to break these error patterns, as shown in FIG. 6 and FIG. 7.

In accordance with embodiments of the invention referring back to FIG. 4B, two schemes are disclosed herein for design of a master interleaver. In a first scheme, the number of the bits in one row-column intersection is identical to the number of the plurality of master codes. The interleaver 403 assigns each of the bits in the one row-column intersection of the TPC codeword to different master codes.

In a second scheme, the number of the bits in one row-column intersection is different from the number of the plurality of master codes. For example, the number of the bits is greater than the number of the plurality of master codes. The interleaver 403 assigns a predetermined number of bits (e.g., two bits) in the one row-column intersection of the TPC codeword to the same master code.

Figure 6:
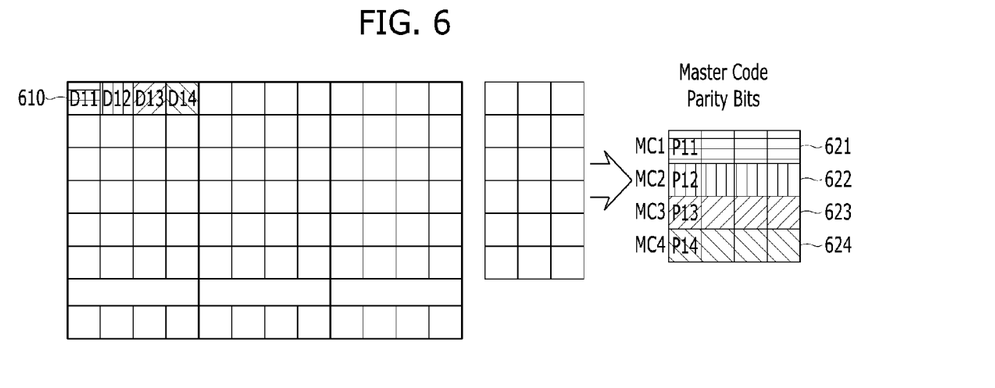
FIG. 6 is a diagram illustrating the operation of an interleaver in accordance with an embodiment of the present invention.
Figure 7:
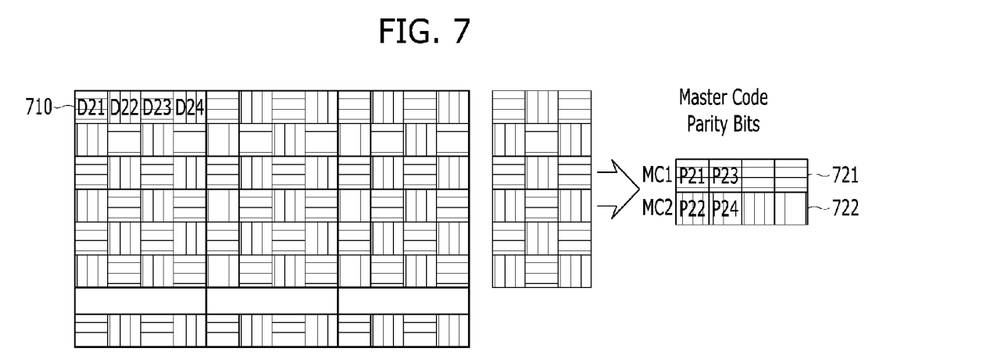
FIG. 7 is a diagram illustrating the operation of an interleaver in accordance with another embodiment of the present invention.

FIG. 6 is a diagram illustrating the operation of an interleaver of the first scheme in accordance with an embodiment of the present invention.

Referring to FIG. 6, bits in the row-column intersection of the TPC codeword are assigned to a plurality of master codes. The number of the bits (e.g., 4 bits) in the row-column intersection is identical to the number of the plurality of master codes (e.g., 4 master codes). Each of the bits in the row-column intersection of the TPC codeword is assigned to different master codes. Bits D11-D14 in the row-column intersection (e.g., in the one row-column intersection) 610 are assigned to the different master codes MC1-MC4 which allows breaking the error patterns in the master decoding procedure. A bit D11 is assigned to a first master code MC1 to generate a parity bit P11. A bit D12 is assigned to a second master code MC2 to generate a parity bit P12. A bit D13 is assigned to a third master code MC3 to generate a parity bit P13. A bit D14 is assigned to a forth master code MC4 to generate a parity bit P14. Thus, for each of the master codes MC1-MC4, master code parity bits 621-624 are generated.

FIG. 7 is a drawing illustrating the operation of an interleaver of the second scheme in accordance with another embodiment of the present invention.

Referring to FIG. 7, bits in a row-column intersection of the TPC codeword are assigned to a plurality of master codes. The number of the bits in the row-column intersection is different from the number of the plurality of master codes. For example, the number of the bits (e.g., 4 bits) in the row-column intersection is greater than the number of the plurality of master codes (e.g., 2 master codes). A limited or predetermined number of bits in the row-column intersection are allowed to belong to the same master code. For example, 2 bits D21 and D23 in the one row-column intersection 710 are assigned to a master code MC11. Two bits D22 and D24 in the one row-column intersection 710 are assigned to a master code MC12. Thus, for each of the master codes MC11-MC12, master code parity bits 721-722 are generated.

An additional benefit of using the disclosed schemes is that the hardware implementation for the encoder and decoder is simplified compared to using a random interleaver. All the bits in the row-column intersection may be read in a single chunk for computing parity bits for the row, column and master codewords during encoding, and calculating syndromes during decoding.

Figure 8A:
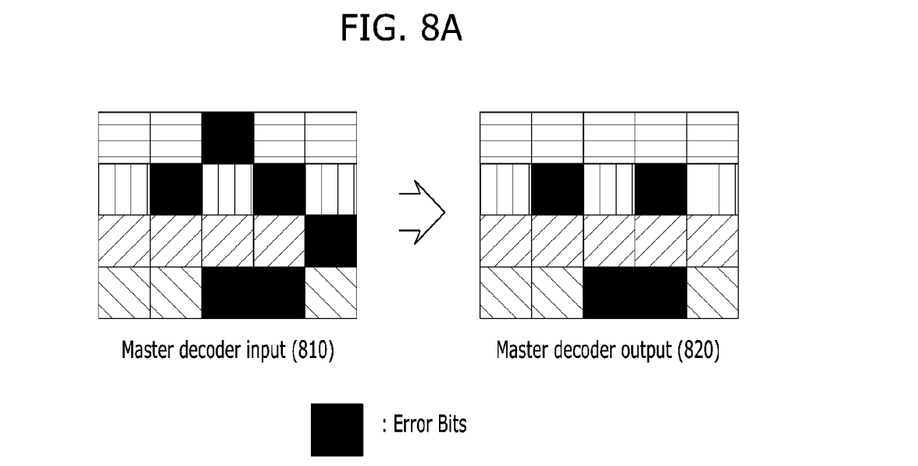
FIG. 8A is a diagram illustrating the performance in the waterfall region of a master code by an interleaver in accordance with an embodiment of the present invention.
Figure 8B:
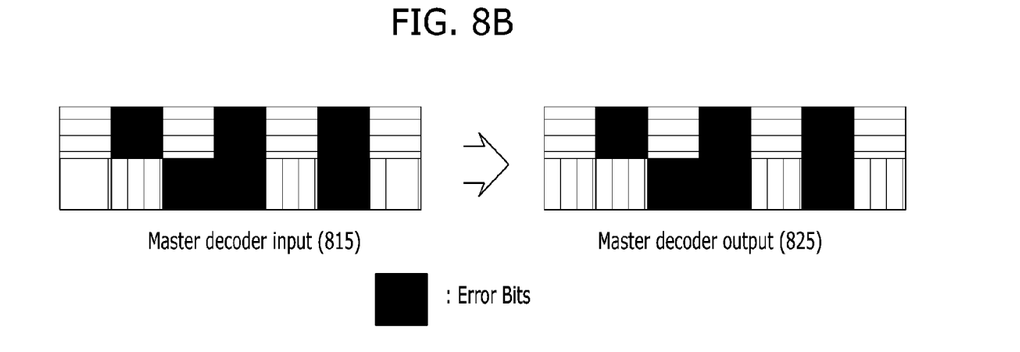
FIG. 8B is a diagram illustrating the performance in the waterfall region of a master code by an interleaver in accordance with another embodiment of the present invention.
Figure 9A:
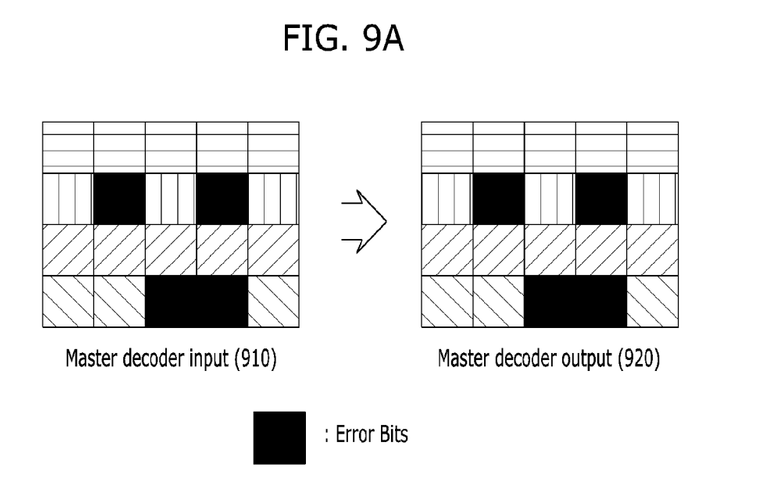
FIG. 9A is a diagram illustrating the performance in the error floor region of a master code by an interleaver in accordance with an embodiment of the present invention.
Figure 9B:
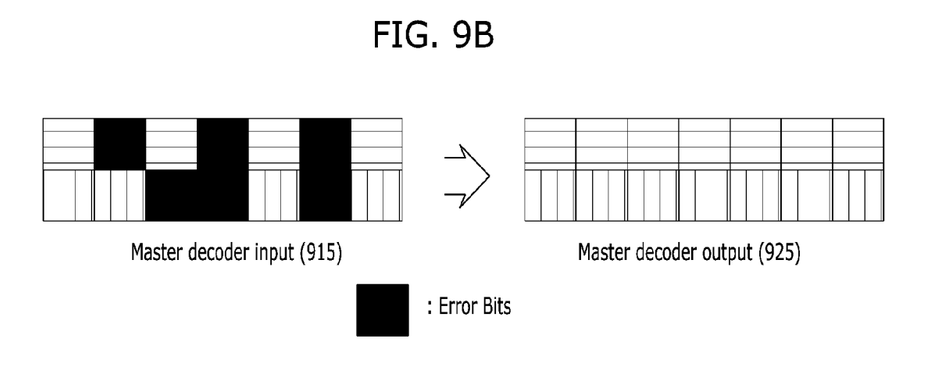
FIG. 9B is a diagram illustrating the performance in the error floor region of a master code by an interleaver in accordance with another embodiment of the present invention.

FIG. 8A through FIG. 9B are diagrams illustrating the performance of master codes by interleavers in accordance with embodiments of the present invention. FIG. 8A and FIG. 8B illustrate the decoding operation in the waterfall region of a master code by an interleaver in the first scheme and the second scheme, respectively. FIG. 9A and FIG. 9B illustrate the decoding operation in the error floor region of a master code by an interleaver in the first scheme and the second scheme, respectively.

In FIG. 8A through FIG. 9B, for the first scheme, the parameters (m,t) equal to (13,1) is assumed for codes in the first scheme, the number of bits in the intersection is assumed to be four, the number of master codes is assumed to be four, and the parity will be 52 (4*13). For the second scheme, the parameters (m,t) equal to (14,2) is assumed for codes in the second scheme, the number of bits in the intersection is assumed to be four, the number of master codes is assumed to be two, and the parity will be 56 (2*28).

Even though the amount of parities for these master codes in the first and second schemes is almost the same, the performance of these master codes may be quite different. Referring to FIG. 8A and FIG. 8B, in the waterfall region, there will be a lot of errors (e.g., six bits) in the data. The first scheme may correct errors in input data 810 and output data 820 with errors of four bits. The second scheme doesn't correct any errors in input data 815 and output data 825 with errors of six bits. It can be observed from FIG. 8A and FIG. 8B that the first scheme may correct errors, whereas the second scheme doesn't correct any bits. It implies that the first scheme will have a better waterfall performance compared to the second scheme.

Referring to FIG. 9A and FIG. 9B, in the error floor region, there will be fewer errors (e.g., four bits) and most of the master codes will be decodable. The error patterns are shown where most of the master codes are decodable. It can be seen that the second scheme is able to correct errors (FIG. 9B), whereas the first scheme doesn't correct any error (FIG. 9A). It implies that the second scheme has a better error floor compared to the first scheme. The interleaver proposed in the second scheme is preferable for data storage purposes, because it improves the error floor significantly.

Figure 10:
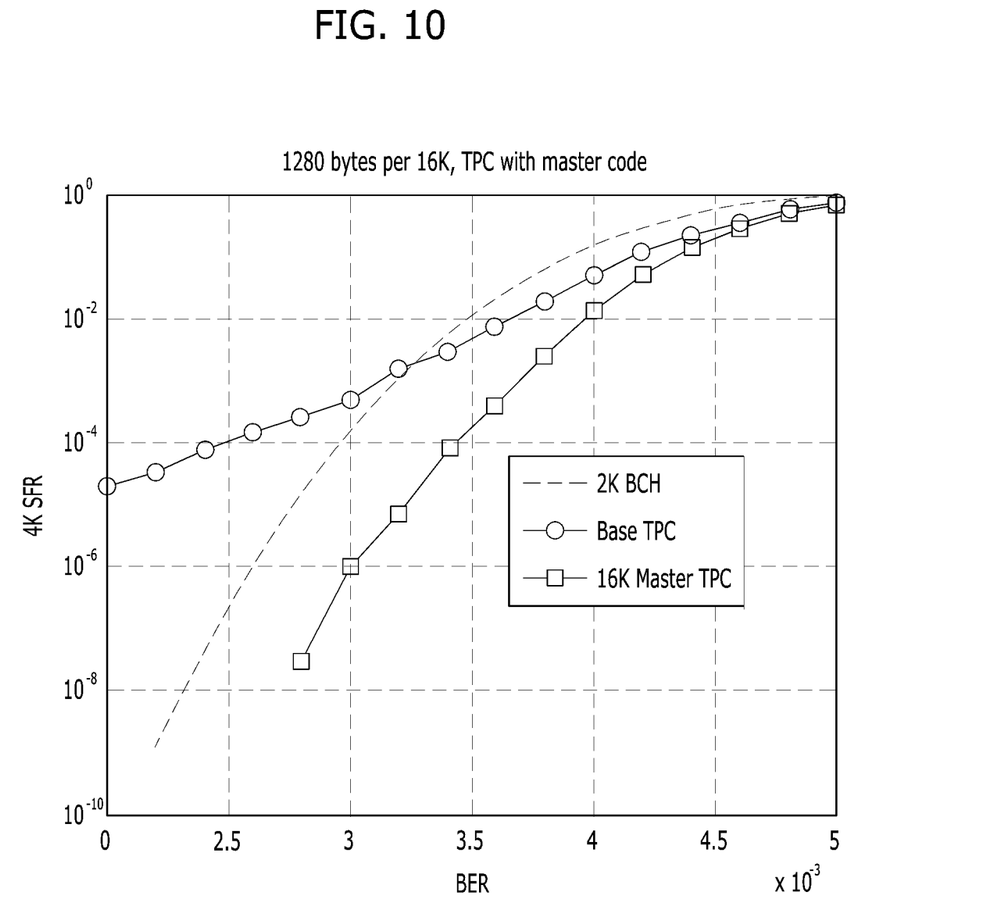
FIG. 10 is a graph illustrating the performance of master codes in accordance with embodiments of the present invention.

FIG. 10 is a graph illustrating the performance of a master code in accordance with embodiments of the present invention. In FIG. 10, it is shown the performance of a master code with the proposed interleaver (16K Master TPC) compared to a BCH (2K) code and a base TPC code. In the simulation, a master code with following parameters is used:

Row Codes: $(n_r,k_r,T_r,m_r)$=(919,889,3,10)
Column Codes: $(n_c,k_c,T_c,m_c)$=(881,851,3,10)
Master code: $(n_m,k_m,T_m,m_m)$=(7066,7040,2,13)
Number of master codes=20
The number of columns combined $C_\#$ is 23.

Referring to FIG. 10, the performance of the base TPC code is shown. The error floor is pushed down around 1e-4 ($10^{-4}$). But this error floor is not sufficient for making this scheme practical for the commercial usage. In a certain case, a master code is encoded for the entire page data (16K). If there is a 4K failure, the entire page data may be read for decoding the 4K data. At high code rates, there is a significant performance loss if the master code (16K Master TPC) interleaver of the present invention is not designed appropriately.

In simulation, there is no error floor observed for the disclosed master code (16K Master TPC) until 4 kB failure equals to 1e-9 ($10^{-9}$). Simulations are conducted to collect the error patterns which are failing during the decoding. From error patterns, it is decided how many intersections need to be spread across master codes so that these patterns get decoded in the master code decoding. The error floor requirement will determine the parameters like the correction capability of master codes and number of bits from the intersection allowed in a single master code.

It should be noted that a master code interleaver design strategy of the present invention gives significant water fall and error floor gain compared to the 2K BCH code and the base TPC code.

Another key advantage of the scheme of the present invention is that the hardware implementation is simple. If a random interleaver is chosen, the bits need to be read randomly to create the master code parity. Since the present invention selects the bits from the intersection, thus the construction of master code parity may be done by reading sequentially along the intersection bits. This simplifies the hardware design significantly and provides a huge memory read overhead savings.

While the present invention has been particularly shown and described with reference to exemplary embodiments thereof, it will be understood by those of ordinary skill in the art that various changes in form and details may be made therein without departing from the spirit and scope of the present invention as defined by the following claims. Thus, the foregoing is by way of example only and is not intended to be limiting. For example, any numbers of elements illustrated and described herein are by way of example only. The present invention is limited only as defined in the following claims and equivalents thereof.

What is claimed is:

1. An apparatus comprising:
   a codeword generator suitable for receiving a data in a matrix, and generating a turbo product code (TPC) codeword including the data, row parities and column parities; and
   an interleaver suitable for interleaving the TPC codeword by assigning bits of at least one row-column intersection of the TPC codeword to a plurality of master codes, wherein the number of the bits of at least one row-column intersection is different from the number of the plurality of master codes, each of the plurality of master codes corresponding to more than one of the bits of at least one row-column intersection, and output the interleaved TPC codeword.

2. The apparatus of claim 1, wherein the codeword generator is suitable for:
   generating the row parities from row data of the matrix;
   generating the column parities by combining the row parities and column data; and
   generating the TPC codeword including the data, the row parities and the column parities.

3. The apparatus of claim 1, wherein the number of the bits of at least one row-column intersection is identical to the number of the plurality of master codes.

4. The apparatus of claim 3, wherein the interleaver is suitable for assigning each of the bits of at least one row-column intersection to different master codes.

5. The apparatus of claim 1, wherein the number of the bits of at least one row-column intersection is greater than the number of the plurality of master codes.

6. The apparatus of claim 1, wherein the interleaver is suitable for assigning a predetermined number of bits of at least one row-column intersection to the same master code.

7. The apparatus of claim 6, wherein the predetermined number of bits of at least one row-column intersection includes two bits in the at least one row-column intersection.

8. The apparatus of claim 1, wherein the row parities are of a serial concatenation structure.

9. A method comprising:
generating a turbo product code (TPC) codeword including a data in a matrix, row parities and column parities;
interleaving the TPC codeword by assigning bits of at least one row-column intersection of the TPC codeword to a plurality of master codes, wherein the number of the bits of at least one row-column intersection is different from the number of the plurality of master codes, each of the plurality of master codes is corresponding to more than one of the bits of at least one row-column intersection; and
outputting the interleaved TPC codeword.

10. The method of claim 9, wherein the generating of the TPC codeword comprises:
generating the row parities from row data of the matrix;
generating the column parities by combining the row parities and column data; and
generating the TPC codeword including the data, the row parities and the column parities.

11. The method of claim 9, wherein the number of the bits of at least one row-column intersection is identical to the number of the plurality of master codes.

12. The method of claim 11, wherein the interleaving of the TPC codeword comprises:
assigning each of the plurality of bits of at least one row-column intersection to different master codes.

13. The method of claim 9, wherein the number of the bits of the at least one row-column intersection is greater than the number of the plurality of master codes.

14. The method of claim 9, wherein the interleaving of the TPC codeword comprises:
assigning a predetermined number of bits of the at least one row-column intersection to the same master code.

15. The method of claim 14, wherein the predetermined number of bits of the at least one row-column intersection includes two bits in the at least one row-column intersection.

16. The method of claim 9, wherein the row parities are of a serial concatenation structure.

* * * * *